(12) United States Patent
Han et al.

(10) Patent No.: US 11,955,340 B2
(45) Date of Patent: Apr. 9, 2024

(54) SEMICONDUCTOR DEVICE AND METHOD OF MANUFACTURING THE SAME

(71) Applicant: SK hynix Inc., Icheon-si Gyeonggi-do (KR)

(72) Inventors: Dae Hee Han, Icheon-si Gyeonggi-do (KR); Sung Soon Kim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 18/328,660

(22) Filed: Jun. 2, 2023

(65) Prior Publication Data

US 2023/0317461 A1     Oct. 5, 2023

Related U.S. Application Data

(63) Continuation of application No. 17/185,670, filed on Feb. 25, 2021, now Pat. No. 11,710,639.

(30) Foreign Application Priority Data

Aug. 21, 2020   (KR) ........................ 10-2020-0105558

(51) Int. Cl.
*H01L 21/00* (2006.01)
*H01L 21/30* (2006.01)
*H01L 21/324* (2006.01)
*H01L 29/66* (2006.01)

(52) U.S. Cl.
CPC ........ *H01L 21/3003* (2013.01); *H01L 21/324* (2013.01); *H01L 29/66666* (2013.01)

(58) Field of Classification Search
CPC ............... H01L 21/3003; H01L 21/324; H01L 29/66666
See application file for complete search history.

(56) References Cited

U.S. PATENT DOCUMENTS

| | | | |
|---|---|---|---|
| 5,872,387 A | 2/1999 | Lyding et al. | |
| 5,972,765 A | 10/1999 | Clark et al. | |
| 6,017,806 A | 1/2000 | Harvey | |
| 9,728,551 B1 | 8/2017 | Lu et al. | |
| 2005/0158976 A1* | 7/2005 | Luoh ................. | H01L 29/42324 257/E21.209 |

FOREIGN PATENT DOCUMENTS

KR     1020110020533 A     3/2011

OTHER PUBLICATIONS

Kangguo Cheng et al., Deuterium pressure dependence of characteristics and hot-carrier reliability of CMOS devices, Microelectronic Engineering 56, 2001, p. 353-p. 358, Elsevier.

* cited by examiner

*Primary Examiner* — Richard A Booth
(74) *Attorney, Agent, or Firm* — William Park & Associates Ltd.

(57) ABSTRACT

A method of manufacturing a semiconductor device includes forming a stack in which first material layers and second material layers are alternately stacked, forming a channel structure passing through the stack, forming openings by removing the first material layers, forming an amorphous blocking layer in the openings, and performing a first heat treatment process to supply deuterium through the openings and substitute hydrogen in the channel structure with the deuterium.

5 Claims, 19 Drawing Sheets

SEMICONDUCTOR DEVICE AND METHOD OF MANUFACTURING THE SAME

CROSS-REFERENCE TO RELATED APPLICATION

The present application is a continuation application of U.S. patent application Ser. No. 17/185,670, filed on Feb. 25, 2021, and claims priority under 35 U.S.C. § 119(a) to Korean patent application number 10-2020-0105558, filed on Aug. 21, 2020, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of manufacturing the semiconductor device.

2. Related Art

Recently, as the improvement of integration of two-dimensional memory devices including memory cells formed on a substrate in a single layer has reached diminishing returns, three-dimensional memory devices including memory cells stacked in a vertical direction on a substrate has been proposed. Furthermore, in order to improve the operational reliability of a memory device having a three-dimensional structure, various structures and manufacturing methods have been developed.

SUMMARY

Various embodiments of the present disclosure are directed to a semiconductor device which has a stable structure and improved operating characteristics, and a method of manufacturing the same.

An embodiment of the present disclosure may provide for a method of manufacturing a semiconductor device. The method may include forming a stack in which first material layers and second material layers are alternately stacked, forming a channel structure passing through the stack, forming openings by removing the first material layers, forming an amorphous blocking layer in the openings, and performing a first heat treatment process to supply deuterium through the openings and substitute hydrogen in the channel structure with the deuterium.

An embodiment of the present disclosure may provide for a semiconductor device. The semiconductor device may include a stack of alternately stacked conductive layers and insulating layers. The semiconductor device may also include a channel layer passing through the stack, the channel layer including deuterium. The semiconductor device may further include a data storage layer between the conductive layers and the channel layer, the data storage layer including deuterium at a concentration higher than a concentration of deuterium in the channel layer.

DETAILED DESCRIPTION

Specific structural and functional descriptions of embodiments are put forth in this specification or application for purposes of enablement. Presented embodiments are not intended to be exhaustive or limiting, and other embodiments are possible.

Figure 1A:
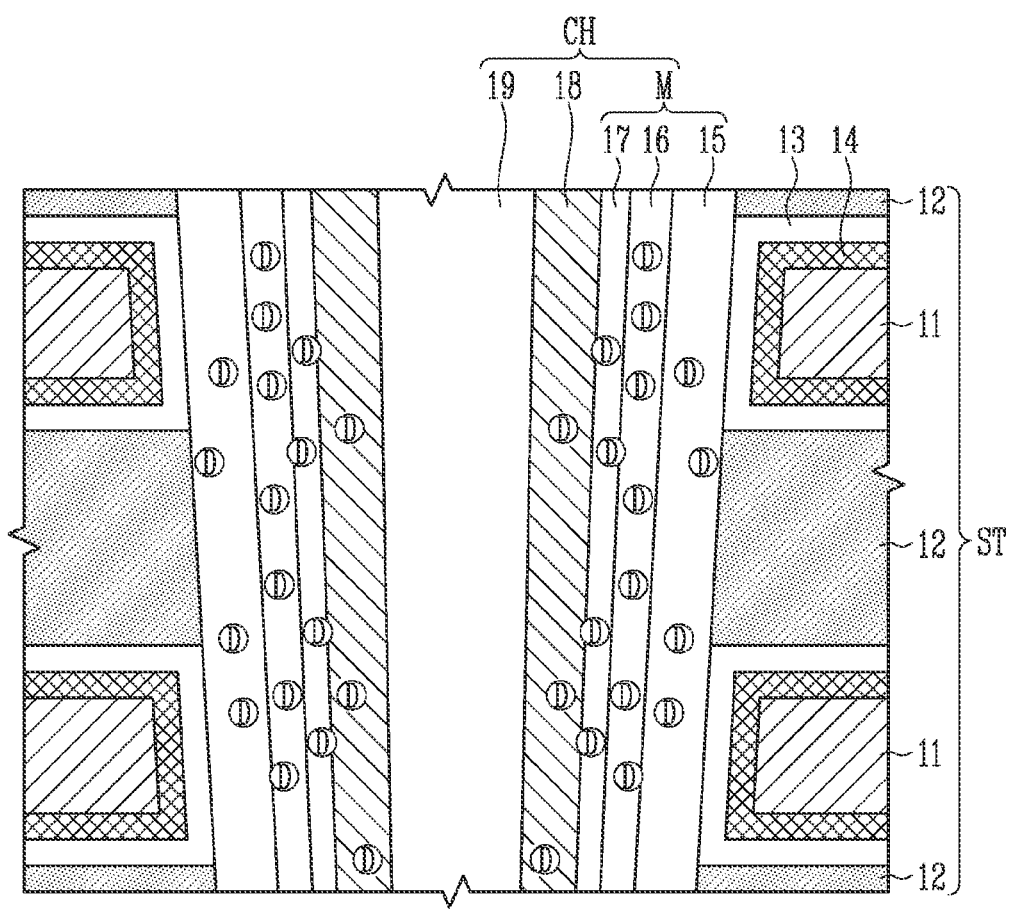
FIGS. 1A and 1B are diagrams illustrating a structure of a semiconductor device according to an embodiment of the present disclosure.
Figure 1B:
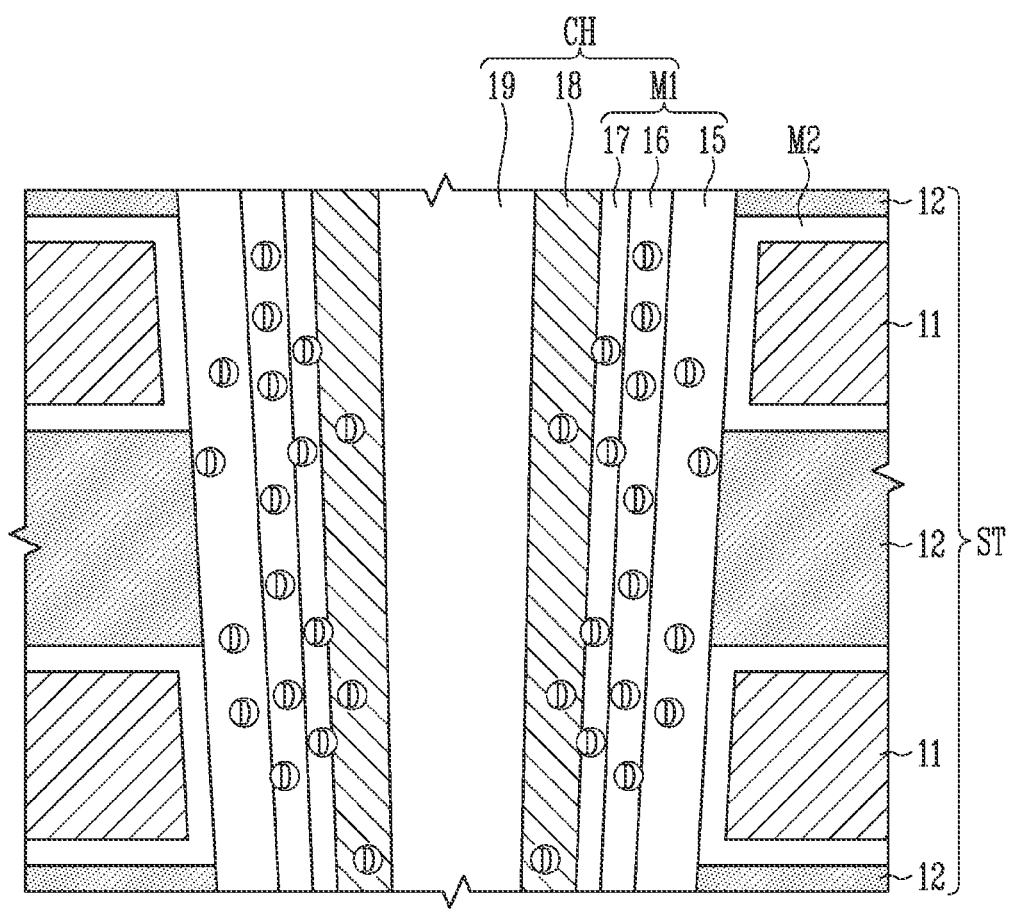

FIGS. 1A and 1B are diagrams illustrating the structure of a semiconductor device according to an embodiment of the present disclosure.

Referring to FIG. 1A, the semiconductor device may include a stack ST, a channel structure CH, and a blocking pattern 13. The semiconductor device may further include a barrier pattern 14.

The stack ST may include conductive layers 11 and insulating layers 12 which are alternately stacked. The conductive layers 11 may be gate electrodes such as a memory cell or a select transistor. The conductive layers 11 may include a conductive material such as polysilicon, metal, tungsten, or molybdenum. The insulating layers 12 may function to insulate the stacked conductive layers 11 from each other, and include insulating material such as an oxide or nitride.

The channel structure CH may pass through the stack ST in the stacking direction of the conductive layers 11 and the insulating layers 12. The memory cell or the select transistor may be positioned in a portion where the channel structure CH and the conductive layers 11 intersect with each other. The channel structure CH may include a channel layer 18 and a memory layer M, and may further include a gap-fill layer 19.

The memory layer M may include a blocking layer 15, a data storage layer 16 or a tunnel insulating layer 17, or include a combination thereof. The memory layer M may be configured such that the tunnel insulating layer 17 covers a sidewall of the channel layer 18, the data storage layer 16 covers the tunnel insulating layer 17, and the blocking layer 15 covers the data storage layer 16.

The channel layer 18 may include a semiconductor material such as silicon (Si) or germanium (Ge), or may include a nano structure. The gap-fill layer 19 may be formed in the channel layer 18. The gap-fill layer 19 may include insulating material such as an oxide, nitride, or an air gap. The data storage layer 16 may be interposed between the channel layer 18 and the conductive layers 11. The data storage layer 16 may include a floating gate, a charge trap material, polysilicon, a nitride, a variable resistance material, a phase change material, a nano structure, etc. The tunnel insulating layer 17 may be interposed between the channel layer 18 and the data storage layer 16. The tunnel insulating layer 17 may include an insulating material such as an oxide. The blocking layer 15 may be interposed between the data storage layer 16 and the conductive layers 11. The blocking layer 15 may include a material having a high dielectric constant (high-k).

The channel structure CH may include 0.5 to 5 at % (atomic percentage) of deuterium. Deuterium is symbolized in the drawings by the letter "D" appearing inside a circle. The blocking layer 15, the data storage layer 16, the tunnel insulating layer 17, the channel layer 18, and the gap-fill layer 19 may contain deuterium at substantially the same concentration or may contain deuterium at different concentrations. Alternatively, some layers of the channel structure CH may not contain deuterium.

The deuterium concentration of the data storage layer 16 may be higher than that of the channel layer 18. The deuterium concentration of the data storage layer 16 may be higher than that of the tunnel insulating layer 17. The deuterium concentration of the tunnel insulating layer 17 may be higher than that of the channel layer 18. The deuterium concentration of the tunnel insulating layer 17 may be higher than that of the blocking layer 15.

The blocking patterns 13 may be interposed between the blocking layer 15 and the conductive layers 11, and may extend between the conductive layers 11 and the insulating layers 12. Each of the blocking patterns 13 may have a "C"-shaped cross-section, as illustrated. The blocking patterns 13 may include a material having a high dielectric constant (high-k). In an embodiment, the blocking patterns 13 may include aluminum oxide. The blocking patterns 13 may have a crystalline state.

The blocking patterns 13 may include 0.5 to 5 at % of deuterium. The deuterium concentration of the blocking patterns 13 may be substantially equal to that of the channel structure CH, or may be lower than that of the channel structure CH. The deuterium concentration of the blocking patterns 13 may be lower than that of the data storage layer 16. The deuterium concentration of the blocking pattern 13 may be lower than that of the tunnel insulating layer 17. The deuterium concentration of the blocking pattern 13 may be lower than that of the channel layer 18.

The barrier patterns 14 may be interposed between the blocking patterns 13 and the conductive layers 11. The barrier patterns 14 may include tantalum nitride, titanium nitride, tungsten nitride, etc. Each of the barrier patterns 14 may have a "C"-shaped cross-section, as illustrated. The barrier patterns 14 might not include deuterium.

Referring to FIG. 1B, the semiconductor device may include a stack ST and a channel structure CH. The semiconductor device may further include a second memory pattern M2. The stack ST may include conductive layers 11 and insulating layers 12 which are alternately stacked. The channel structure CH may include a channel layer 18, and may further include a first memory layer M1 or a gap-fill layer 19. The first memory layer M1 may include a blocking layer 15, a data storage layer 16 or a tunnel insulating layer 17.

The second memory pattern M2 may be interposed between the first memory layer M1 and the conductive layers 11, and may extend between the conductive layers 11 and the insulating layers 12. The second memory pattern M2 may have a "C"-shaped cross-section, as illustrated. The second memory pattern M2 may include a blocking layer, a data storage layer or a tunnel insulating layer, or may include a combination thereof.

The channel structure CH may include 0.5 to 5 at % of deuterium. The second memory pattern M2 may include 0.5 to 5 at % of deuterium. The deuterium concentration of the second memory pattern M2 may be lower than that of the tunnel insulating layer 17. The deuterium concentration of the second memory pattern M2 may be lower than that of the channel layer 18.

According to the above-described structure, the channel structure CH may include deuterium. In an embodiment, the channel structure CH may have an Si-D bond or an N-D bond. Because the Si-D bond or the N-D bond has higher bonding energy compared to an Si—H bond or an N—H bond, the channel structure CH having the Si-D bond or the N-D bond is more resistant to electrical stress compared to a channel structure having the Si—H bond or the N—H bond. Therefore, a deterioration in reliability due to electrical stress may be mitigated or suppressed. Furthermore, deuterium may be bonded to a dangling bond, a grain boundary, a trap site, and the like of the channel structure CH. Thus, the layer quality of the channel structure CH may be improved, and a breakdown voltage may be improved. Si, N, H, and D represent the chemical symbols for silicon, nitrogen, hydrogen, and deuterium, respectively.

FIGS. 2A to 2D are diagrams illustrating a method of manufacturing a semiconductor device in accordance with an embodiment of the present disclosure. Hereinbelow, repetitive explanations will be omitted to avoid redundancy.

Figure 2A:
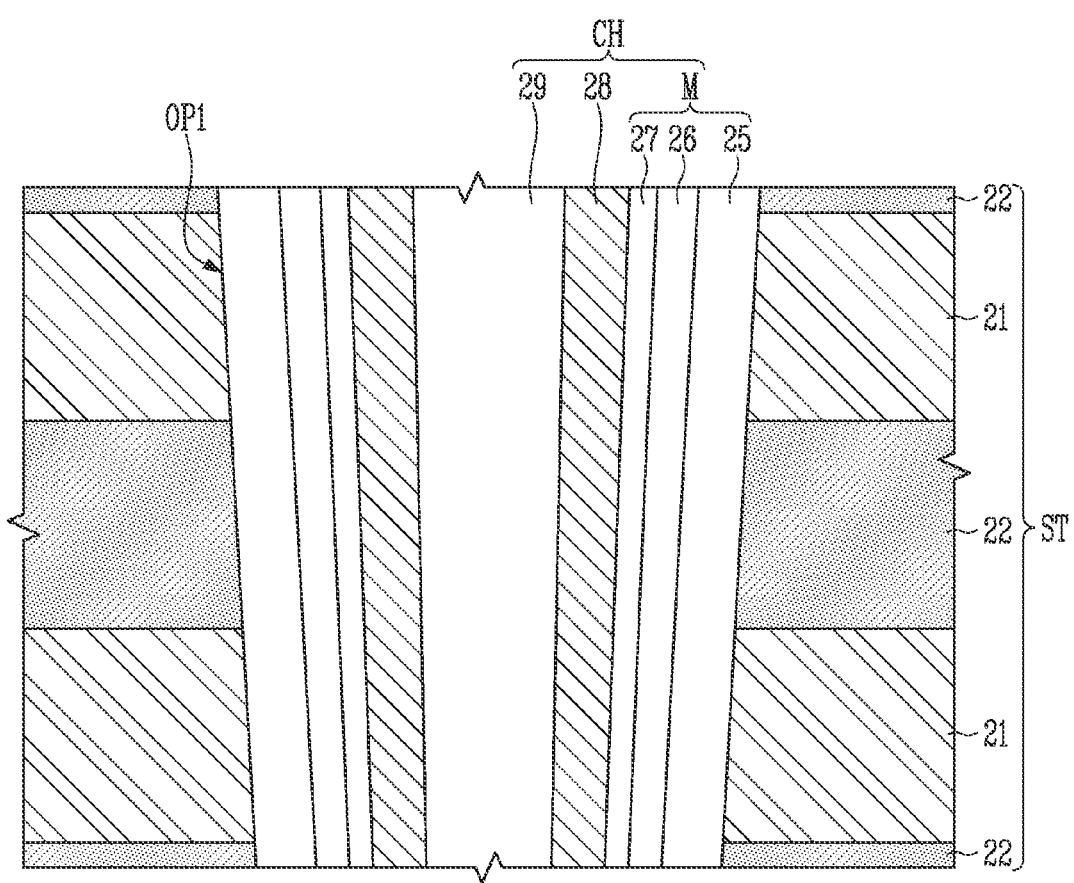
FIGS. 2A to 2D are diagrams illustrating a method of manufacturing a semiconductor device in accordance with an embodiment of the present disclosure.

Referring to FIG. 2A, a stack ST is formed. The stack ST may include first material layers 21 and second material layers 22 that are alternately stacked. The first material layers 21 may include a material having a high etch selectivity with respect to the second material layers 22. In an embodiment, the first material layers 21 may include a sacrificial material such as a nitride and polysilicon, and the second material layers 22 may include an insulating material such as an oxide.

Thereafter, a first opening OP1 passing through the stack ST is formed. Subsequently, a channel structure CH is formed in the first opening OP1. First, a memory layer M may be formed in the first opening OP1. A first blocking layer 25, a data storage layer 26, and a tunnel insulating layer 27 may be formed in the first opening OP1, or some of them may be formed. Subsequently, a channel layer 28 may be formed in the memory layer M. A gap-fill layer 29 may be formed in the channel layer 28.

Figure 2B:
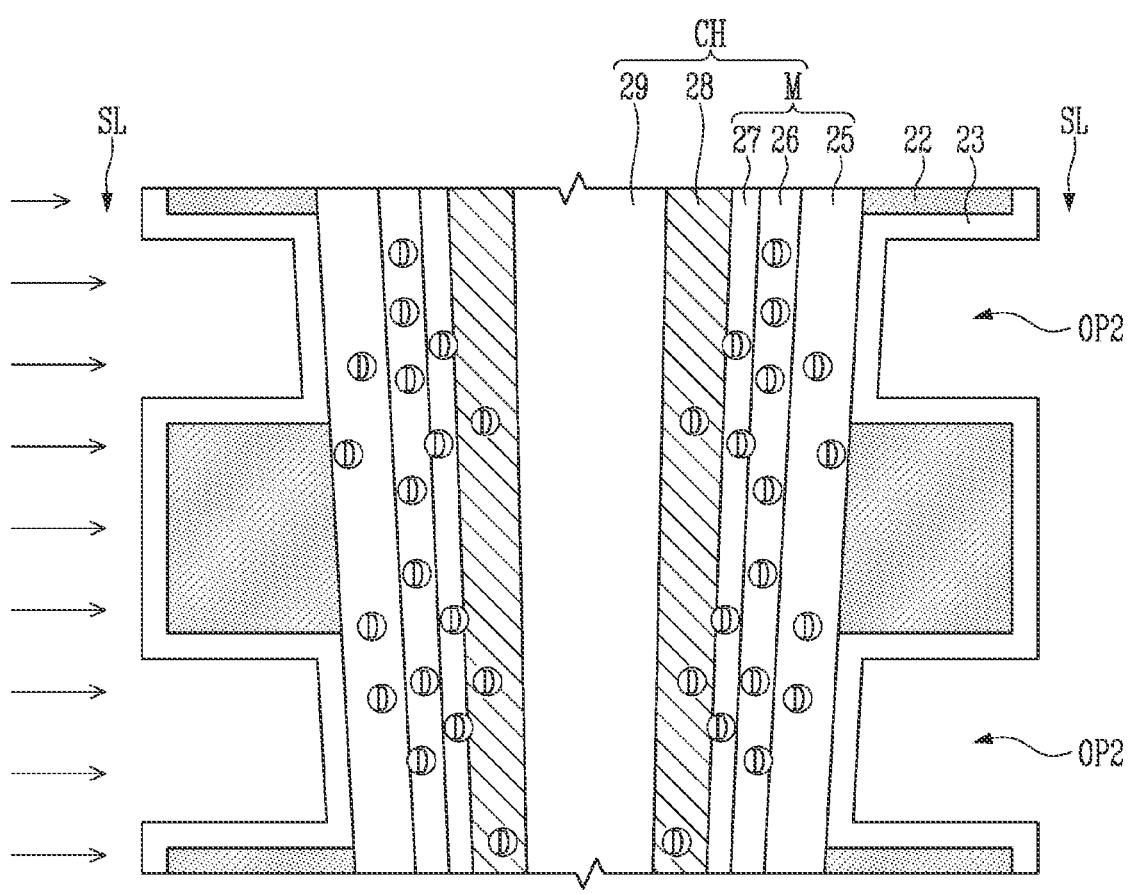

Referring to FIG. 2B, the first material layers 21 are removed to form second openings OP2. In an embodiment, after a slit SL passing through the stack ST is formed, the first material layers 21 exposed through the slit SL are selectively etched, thus forming the second openings OP2. The memory layer M may be exposed through the second openings OP2. Thereafter, the second blocking layer 23 is formed in the second openings OP2. In an embodiment, the second blocking layer 23 may be formed using a deposition process. The second blocking layer 23 may be conformally deposited along the profile of the slit SL and the second openings OP2. The second blocking layer 23 may be deposited in an amorphous state.

Subsequently, deuterium is supplied through the second openings OP2 and a heat treatment process is performed. The deuterium supplied through the second openings OP2 may be diffused into the first blocking layer 25, the data storage layer 26, the tunnel insulating layer 27, the channel layer 28, and the like through the second blocking layer 23. Thus, hydrogen in the channel structure CH may be substituted with deuterium. The Si—H bond or the N—H bond in the channel structure CH may be changed into the Si-D or N-D bond. When the second blocking layer 23 is deposited in the amorphous state, the second blocking layer 23 of the amorphous state may be crystallized by the heat treatment process. The second blocking layer 23 may be partially or completely crystallized.

In an embodiment, the heat treatment process may be performed at a high temperature of 600 to 1000° C. By performing the heat treatment process at the high temperature, a deuterium substitution rate may be increased. The heat treatment process may be performed at a pressure of 0.01 to 20 atm. In an embodiment, the heat treatment process may be performed at the lower pressure of 0.1 to 5 atm. When the heat treatment process is performed at high pressure, the deuterium substitution rate may be increased but safety may be reduced due to the risk of explosion or the like, compared to the case of performing the heat treatment process at low pressure. Therefore, by performing the heat treatment process under high temperature and low pressure conditions, the deuterium substitution rate may be safely increased.

The heat treatment process may be performed for a period of 0.01 to 10 Hr. In the heat treatment process, $D_2$ gas may have a flow rate in a range of 1 to 10 slm. The deuterium substitution rate may be increased by increasing the gas flow rate. Alternatively, the heat treatment process may be performed by a wet oxidation process using $D_2$ gas and $O_2$ gas. The deuterium substitution rate may be increased by using the wet oxidation process.

The channel structure CH may include 0.5 to 5 at % of deuterium, by the heat treatment process using deuterium gas. Depending on the conditions of the heat treatment process, the distribution of deuterium in the channel structure CH may be adjusted. According to the above-described conditions, the deuterium concentration of the data storage layer 26 may be higher than that of the tunnel insulating layer 27. The deuterium concentration of the tunnel insulating layer 27 may be higher than that of the channel layer 28. The deuterium concentration of the channel layer 28 may be higher than that of the first blocking layer 25. The deuterium concentration of the channel layer 28 may be higher than that of the second blocking layer 23.

Figure 2C:
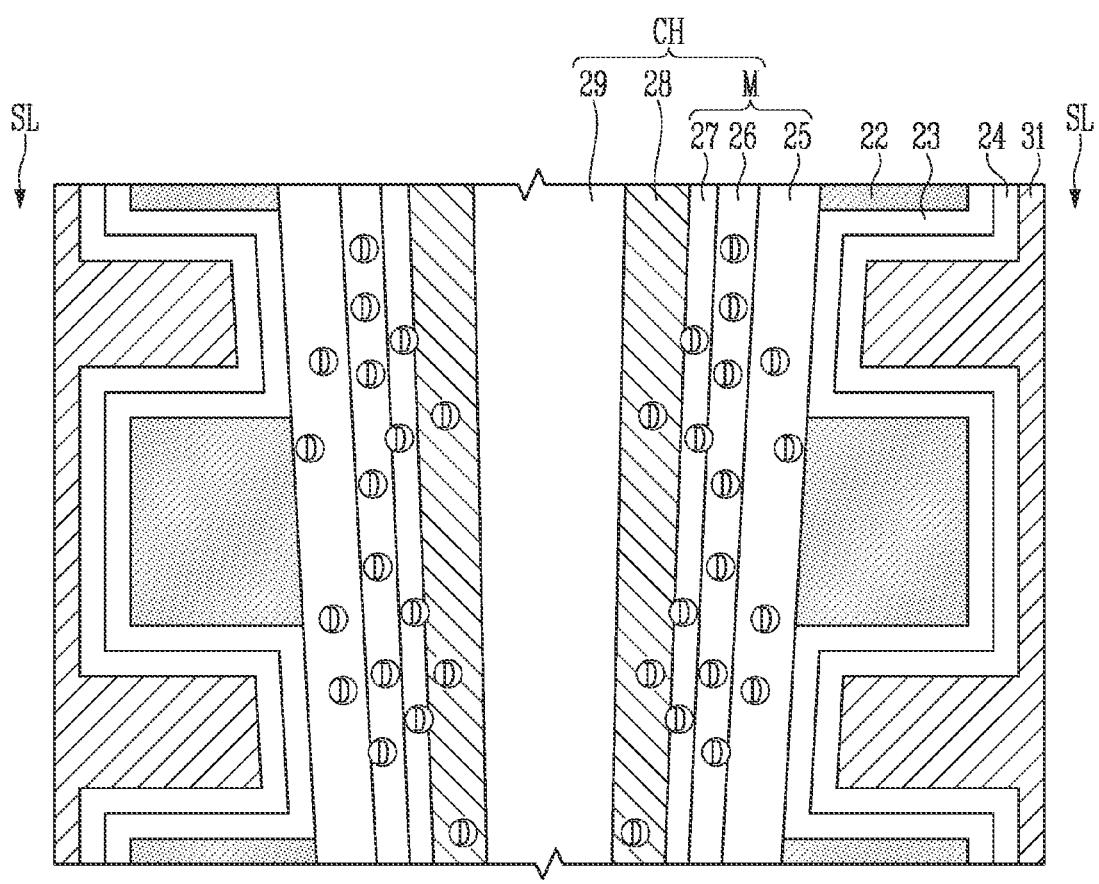

Referring to FIG. 2C, a barrier layer 24 is formed. The barrier layer 24 may be formed in the slit SL and the second openings OP2. In an embodiment, the barrier layer 24 may be formed using a deposition process. The barrier layer 24 may be conformally deposited along the profile of the second blocking layer 23.

In the case of performing a high-temperature process after the barrier layer 24 is formed, the barrier layer 24 may be agglomerated or damaged. In an embodiment of the present disclosure, because the barrier layer 24 is formed after the high-temperature heat treatment process is performed, it is possible to prevent the barrier layer 24 from being damaged by a subsequent process.

Subsequently, a conductive layer 31 is formed. The conductive layer 31 may be formed in the slit SL and the second openings OP2.

Figure 2D:
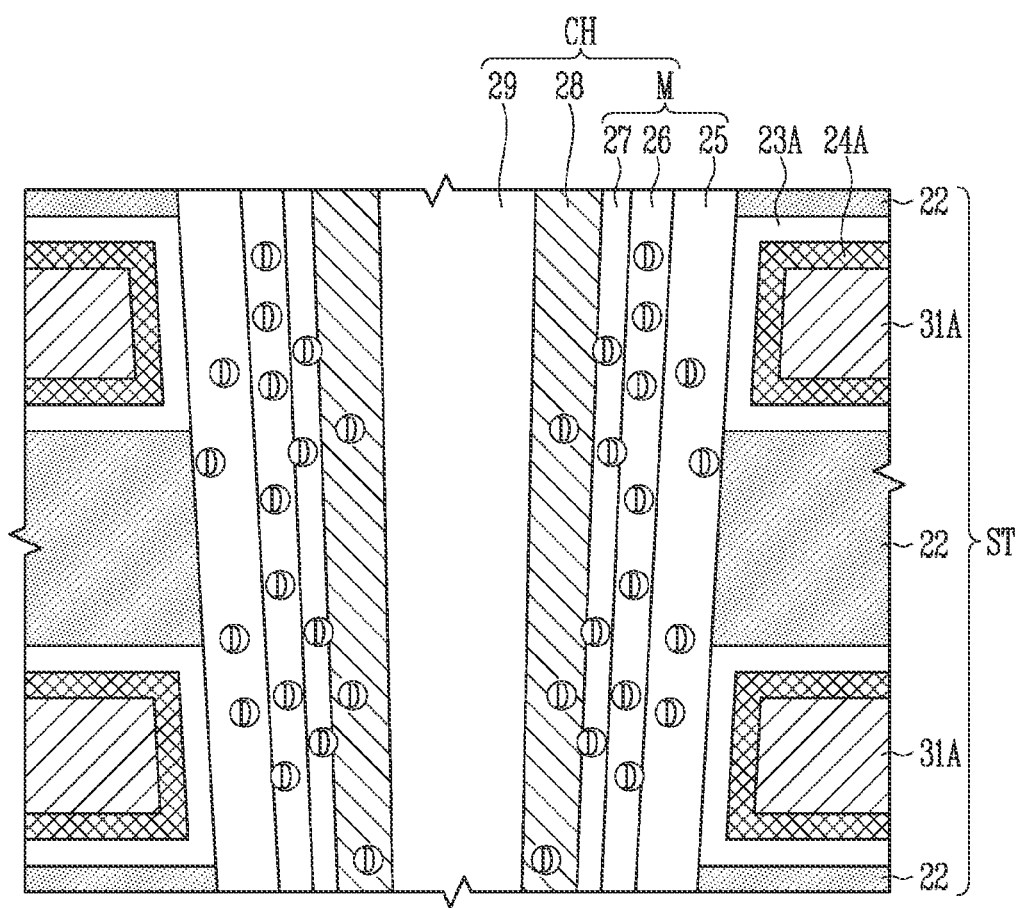

Referring to FIG. 2D, the conductive layer 31, the barrier layer 24, and the second blocking layer 23 are etched. Portions of the conductive layer 31, the barrier layer 24, and the second blocking layer 23 formed in the slit SL may be etched. Thereby, blocking patterns 23A positioned in the second openings OP2, respectively, may be formed. A barrier pattern 24A and a conductive pattern 31A may be positioned in each of the blocking patterns 23A.

According to the above-described manufacturing method, hydrogen in the channel structure CH may be substituted with deuterium through the second openings OP2. Because the heat treatment process is performed under the conditions of high temperature and low pressure, the deuterium substitution rate may be increased.

FIGS. 3A to 3D are diagrams illustrating a method of manufacturing a semiconductor device in accordance with an embodiment of the present disclosure. Hereinbelow, repetitive explanations will be omitted to avoid redundancy.

Figure 3A:
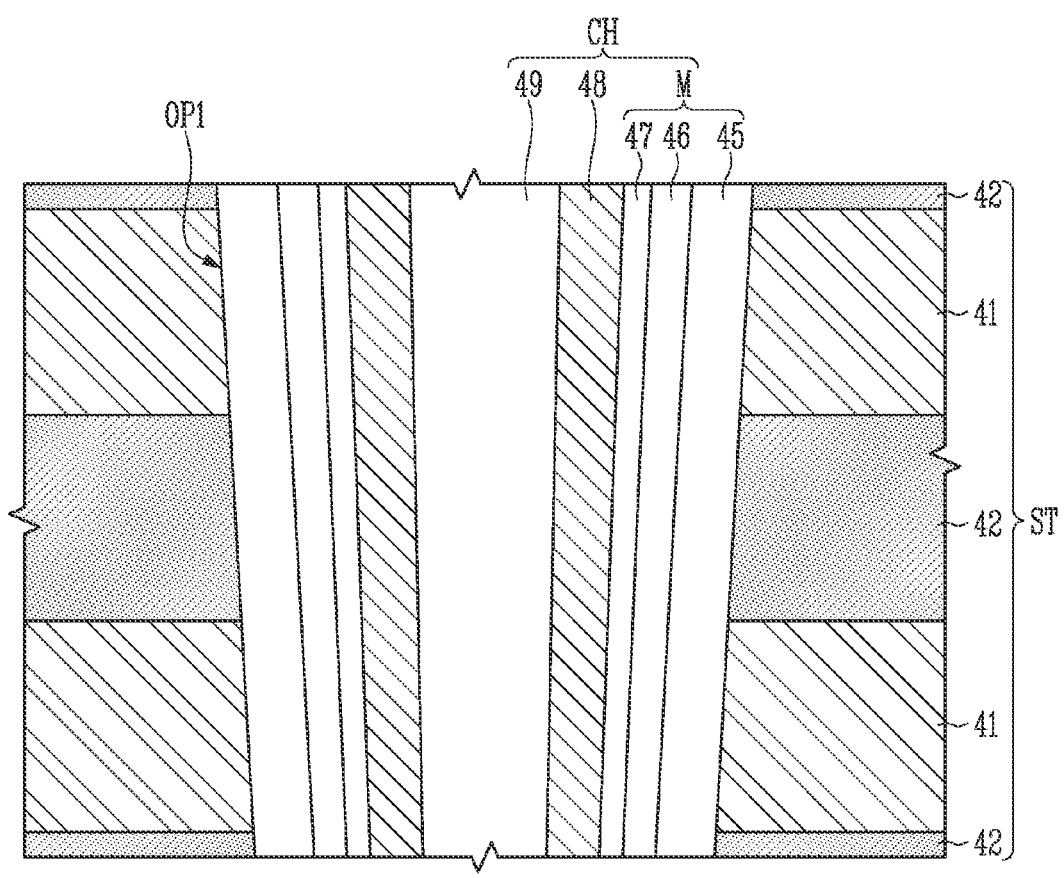
FIGS. 3A to 3D are diagrams illustrating a method of manufacturing a semiconductor device in accordance with an embodiment of the present disclosure.

Referring to FIG. 3A, a stack ST is formed. The stack ST may include first material layers 41 and second material layers 42 that are alternately stacked. Thereafter, a first opening OP1 passing through the stack ST is formed. Subsequently, a channel structure CH is formed in the first opening OP1. The channel structure CH may include a memory layer M, and the memory layer M may include a tunnel insulating layer 47, a data storage layer 46 or a first blocking layer 45, or may include a combination thereof. Subsequently, a channel layer 48 may be formed in the memory layer M. A gap-fill layer 49 may be formed in the channel layer 48.

Figure 3B:
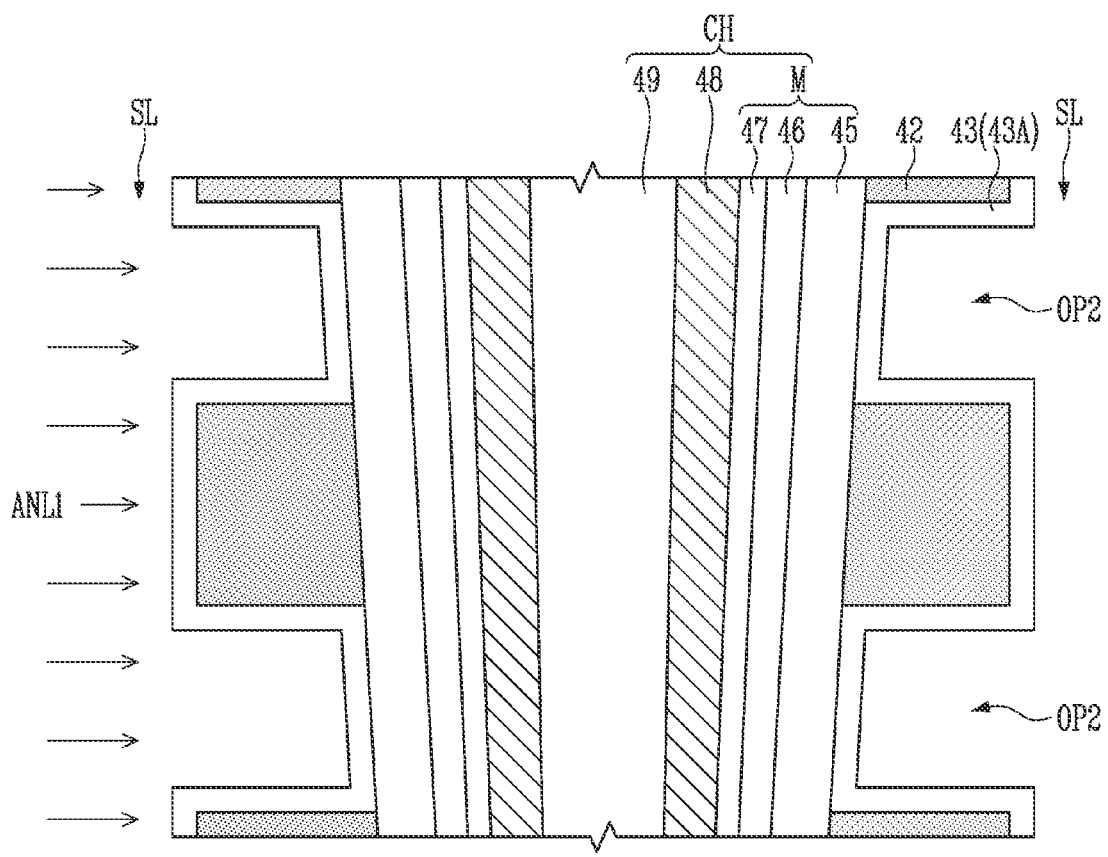

Referring to FIG. 3B, the first material layers 41 are removed to form second openings OP2, and a second blocking layer 43 of an amorphous state is formed in the second openings OP2. Thereafter, a first heat treatment process is performed (ANL1). The first heat treatment process may be used to crystallize the second blocking layer 43 in the amorphous state. The first heat treatment process may be performed at 900 to 1100° C. The second blocking layer 43 having the amorphous state may be partially or wholly crystallized by the first heat treatment process. Thereby, a second blocking layer 43A which partially or wholly has a crystalline state is formed. Because the amorphous layer is crystallized to form the second blocking layer 43A, the second blocking layer 43A may have a superior layer quality compared to the blocking layer deposited in a crystalline state.

Figure 3C:
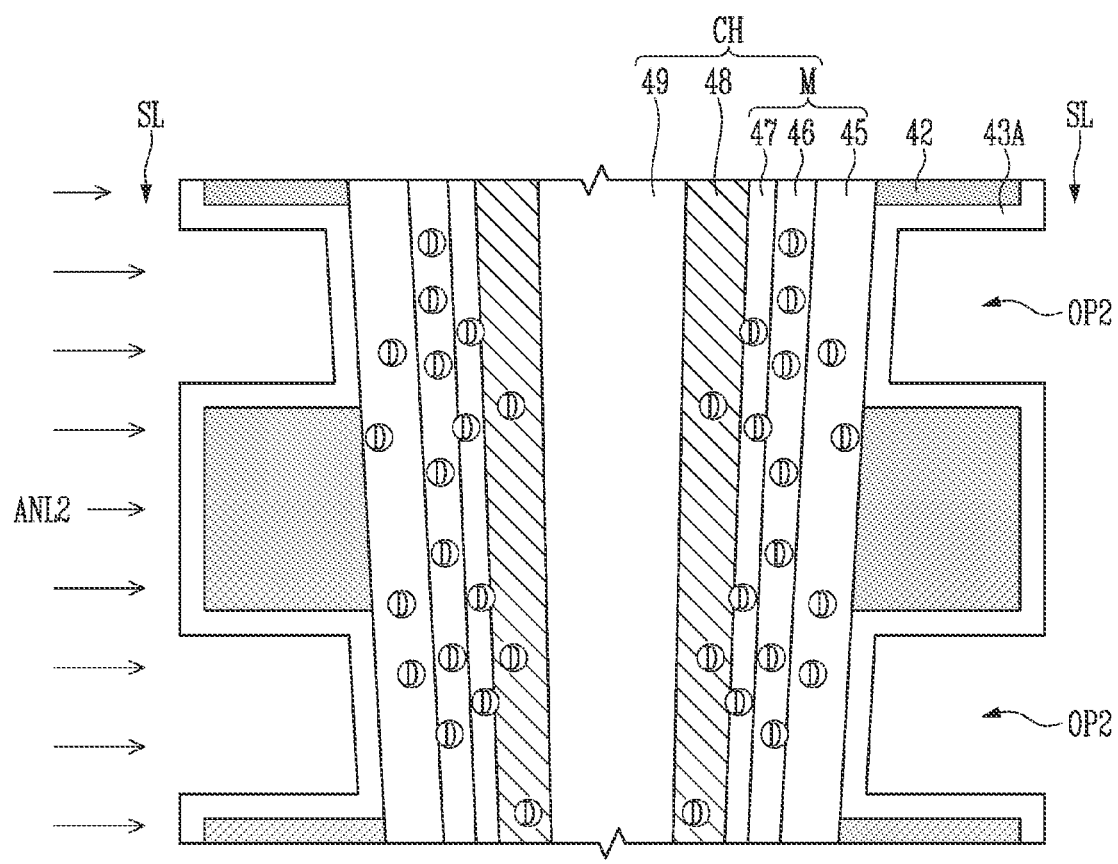

Referring to FIG. 3C, deuterium is supplied through the second openings OP2 and a second heat treatment process is performed (ALN2). Hydrogen in the channel structure CH may be substituted with deuterium by the second heat treatment process. Hydrogen in the second blocking layer 43A may be substituted with deuterium by the second heat treatment process. Furthermore, when the second blocking layer 43A is partially crystallized in the first heat treatment process, the second blocking layer 43A may be wholly crystallized through the second heat treatment process. The second heat treatment process may be performed at a temperature lower than that of the first heat treatment process. If the first heat treatment process requiring a higher temperature is performed after the second heat treatment process is performed, the substituted deuterium may be released. In contrast, according to an embodiment of the present disclosure, because the second heat treatment process is performed after the first heat treatment process requiring the higher temperature is performed, it is possible to prevent the substituted deuterium from being released.

Figure 3D:
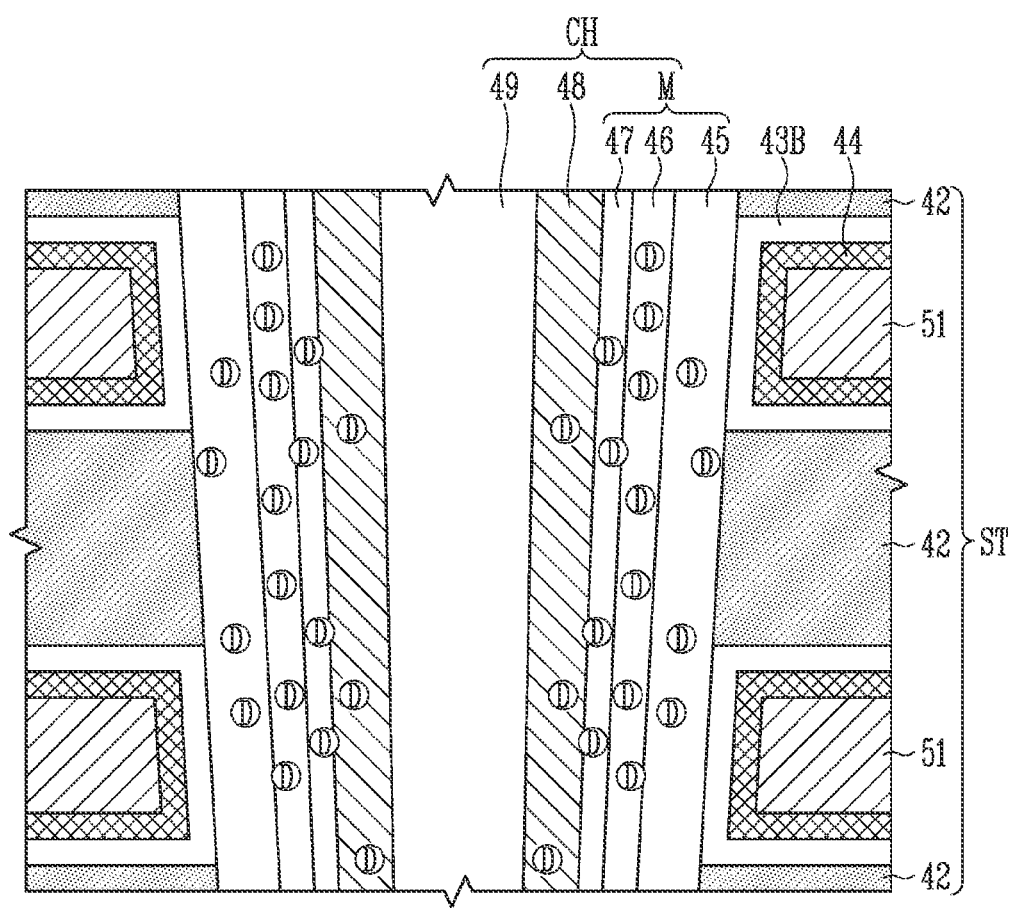

Referring to FIG. 3D, second blocking patterns 43B, barrier patterns 44, and conductive patterns 51 are formed. After the barrier layer and the conductive layer are formed, the barrier layer, the conductive layer, and the second blocking layer 43A formed in the slit SL may be etched to form the barrier patterns 44, the second blocking patterns 43B, and the conductive patterns 51.

According to the above-described manufacturing method, after the second blocking layer 43 is crystallized by the first heat treatment process, the channel structure CH is deuterated by the second heat treatment process. Therefore, it is possible to prevent the substituted deuterium from being released by the high-temperature heat treatment process. Furthermore, after both the first heat treatment process and the second heat treatment process are performed, the barrier patterns 44 are formed. Therefore, the agglomeration of or damage to the barrier patterns 44 may be mitigated or prevented.

FIGS. 4A to 4D are diagrams illustrating a method of manufacturing a semiconductor device in accordance with an embodiment of the present disclosure. Hereinbelow, repetitive explanations will be omitted to avoid redundancy.

Figure 4A:
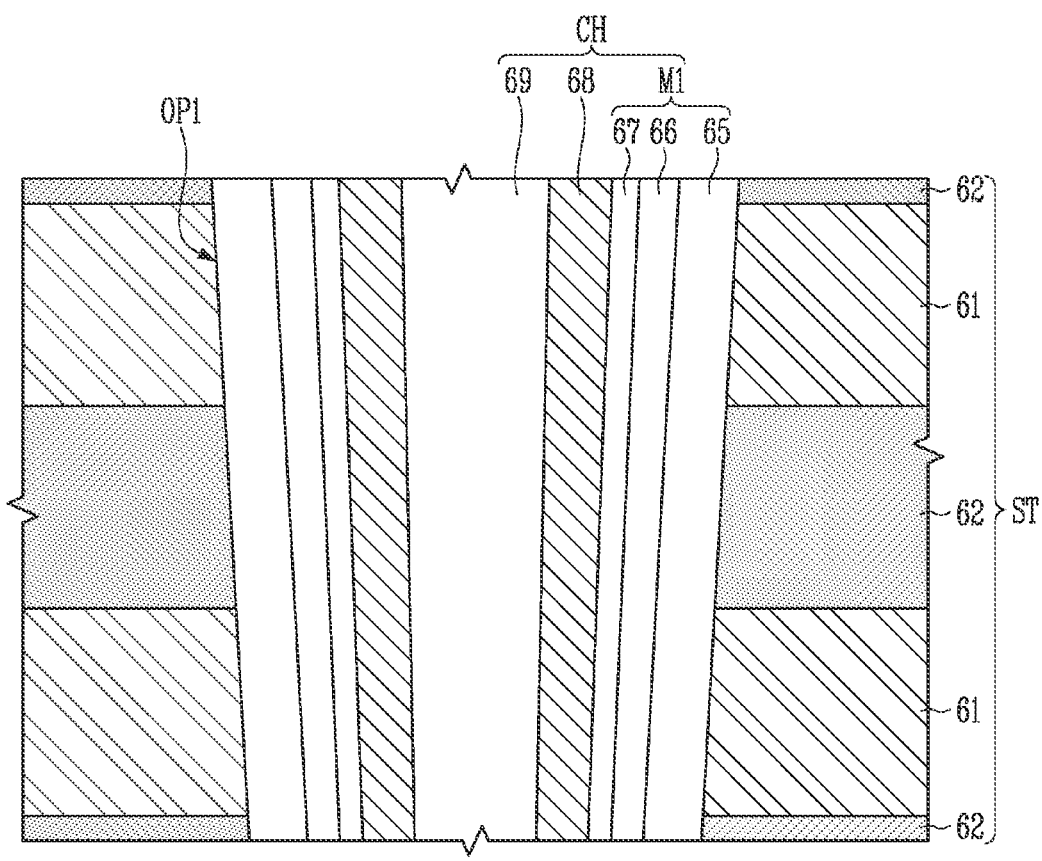
FIGS. 4A to 4D are diagrams illustrating a method of manufacturing a semiconductor device in accordance with an embodiment of the present disclosure.

Referring to FIG. 4A, a stack ST is formed. The stack ST may include first material layers 61 and second material layers 62 that are alternately stacked. Thereafter, a first opening OP1 passing through the stack ST is formed. Subsequently, a channel structure CH is formed in the first opening OP1. The channel structure CH may include a first memory layer M1, and the first memory layer M1 may include a tunnel insulating layer 67, a data storage layer 66 or a first blocking layer 65, or may include a combination thereof. Subsequently, a channel layer 68 may be formed in the first memory layer M1. A gap-fill layer 69 may be formed in the channel layer 68.

Figure 4B:
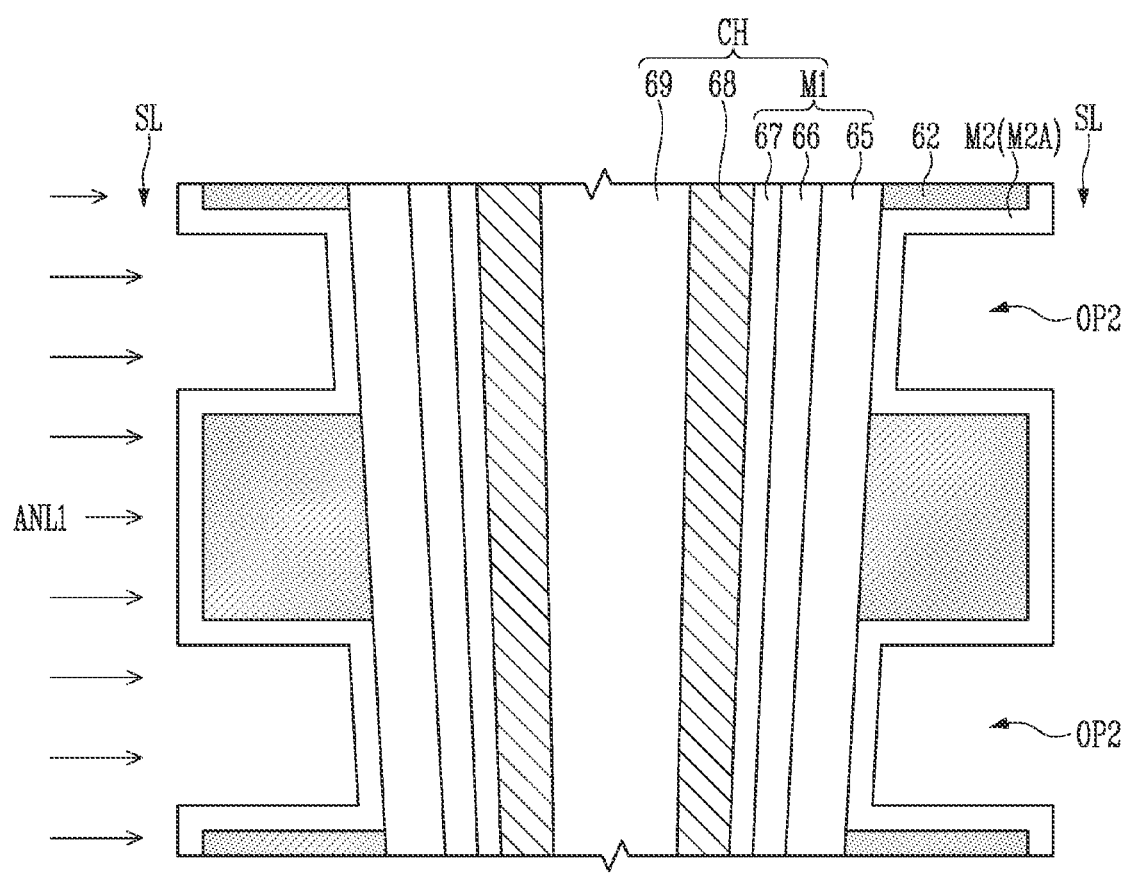

Referring to FIG. 4B, the first material layers 61 are removed to form second openings OP2, and a second memory layer M2 is formed in the second openings OP2. The second memory layer M2 may include a tunnel insulating layer, a data storage layer or a second blocking layer, or may include a combination thereof. The second memory layer M2 may include a layer in an amorphous state.

Thereafter, a first heat treatment process is performed (ANL1). The first heat treatment process may be used to crystallize an amorphous layer included in the second memory layer M2. The first heat treatment process may be performed at 900 to 1100° C. Through this process, the second memory layer M2A including a crystalline layer is formed.

Figure 4C:
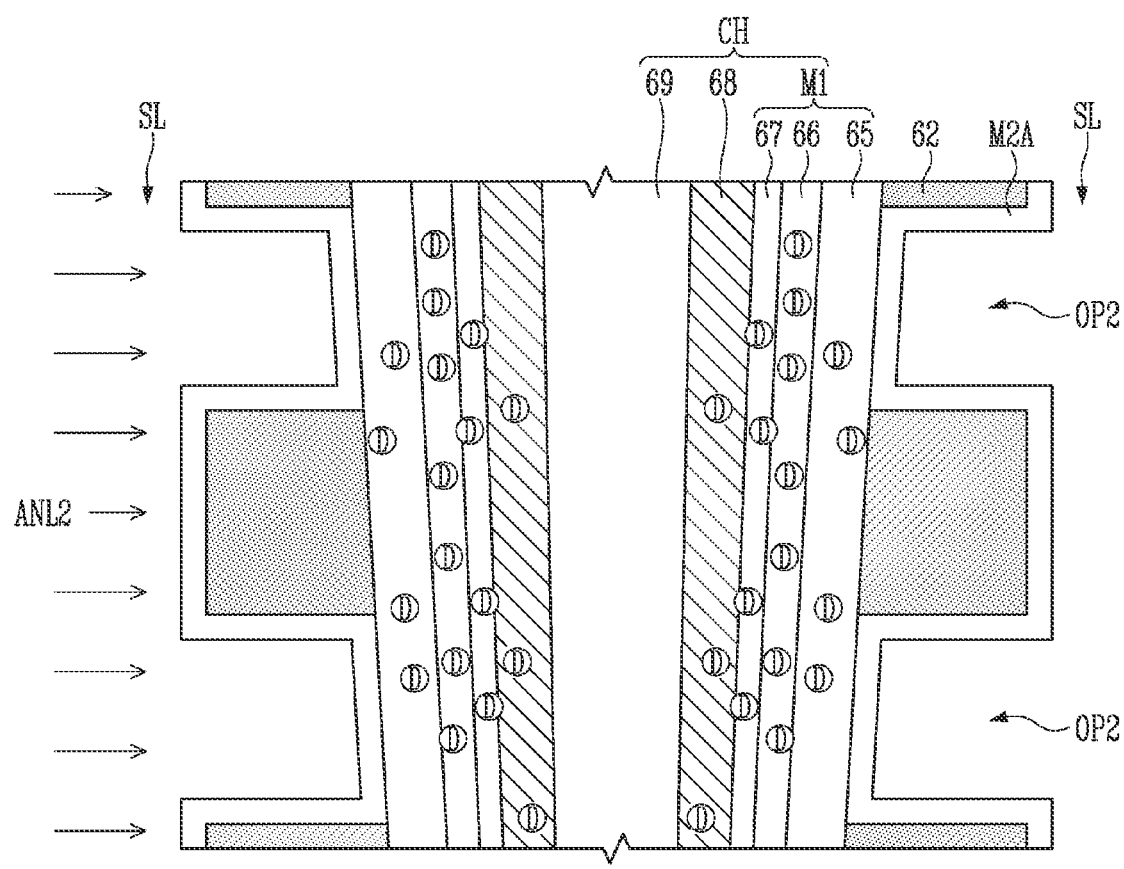

Referring to FIG. 4C, deuterium is supplied through the second openings OP2 and a second heat treatment process is performed (ALN2). Hydrogen in the channel structure CH may be substituted with deuterium by the second heat treatment process. Hydrogen in the second memory layer M2A may be substituted with deuterium by the second heat treatment process. Furthermore, when an amorphous layer of the second memory layer M2A is partially crystallized in the first heat treatment process, the amorphous layer may be wholly crystallized through the second heat treatment process. The second heat treatment process may be performed at a temperature lower than that of the first heat treatment process.

Figure 4D:
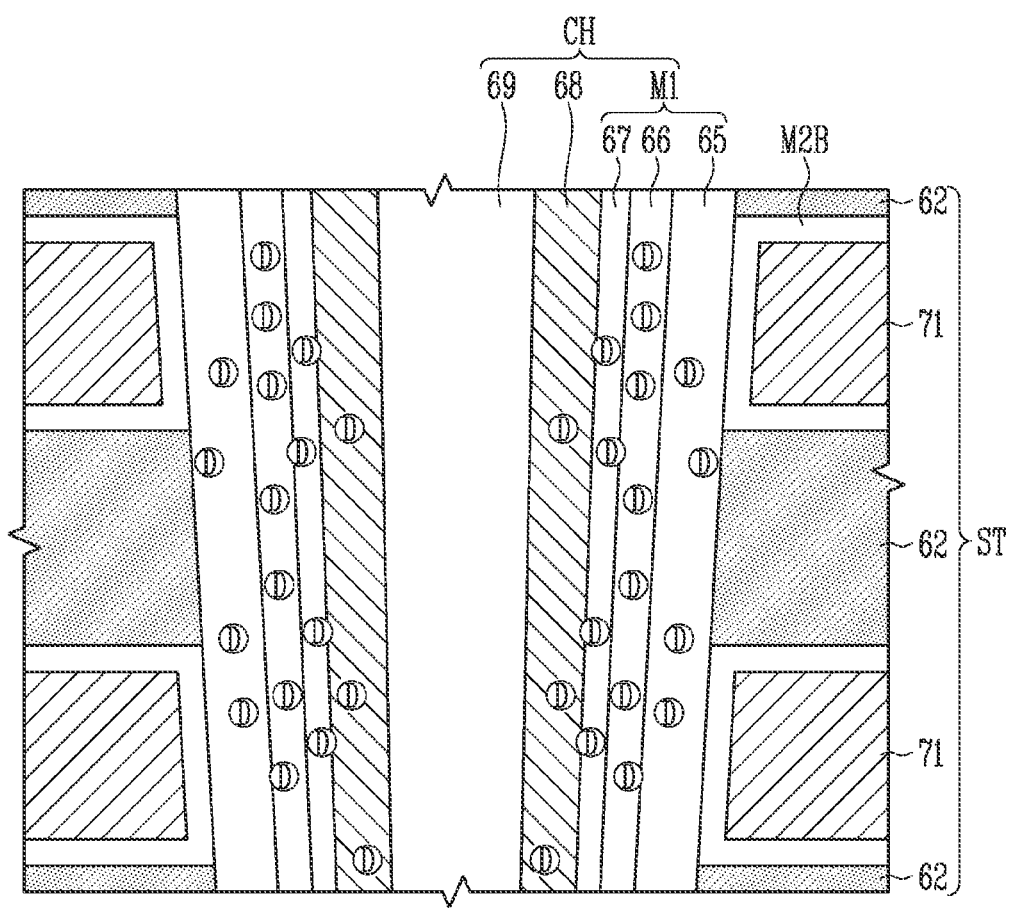

Referring to FIG. 4D, second memory patterns M2B and conductive patterns 71 in the second memory patterns M2B are formed. Barrier patterns may be further formed between the second memory patterns M2B and the conductive patterns 71.

Figure 5:
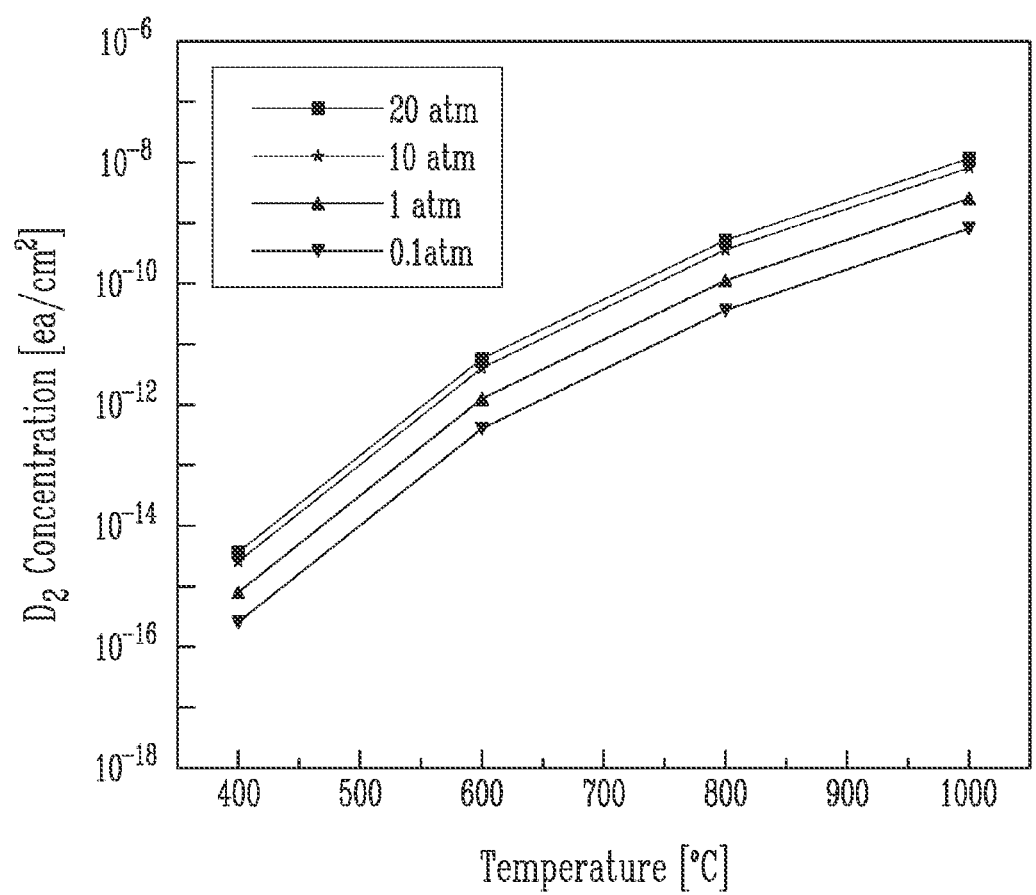
FIG. 5 is a graph illustrating a method of manufacturing a semiconductor device in accordance with an embodiment of the present disclosure.

FIG. 5 is a graph illustrating a method of manufacturing a semiconductor device in accordance with an embodiment of the present disclosure. The x-axis represents the temperature of a heat treatment process, for example, the second heat treatment process described above, and the y-axis represents the deuterium concentration of the heat-treated layer.

As described above, an Si—H bond or an N—H bond in the layer may be changed into an Si-D bond or an N-D bond, by supplying deuterium gas and performing the heat treatment process. The graph of FIG. 5 represents a change in deuterium concentration depending on changes in temperature and pressure of the heat treatment process. The deuterium concentration of the y-axis is related to the deuterium substitution rate. When the deuterium concentration is high, it means that the deuterium substitution rate is high. In contrast, when the deuterium concentration is low, it means that the deuterium substitution rate is low.

Referring to the graph, at the same pressure, the higher the temperature of the heat treatment process, the higher the deuterium concentration. At the same temperature, the higher the pressure of the heat treatment process, the higher the deuterium concentration. Therefore, it can be seen that the higher the temperature and pressure of the heat treatment process, the higher the deuterium substitution rate. Furthermore, the deuterium substitution rate may be more efficiently increased by increasing the temperature rather than increasing the pressure. According to an embodiment of the present disclosure, the deuterium substitution rate of the channel structure CH may be increased by performing the heat treatment process at a high temperature. Furthermore, because the deuterium substitution rate may be sufficiently increased at a high temperature, the pressure may be determined as low or high pressure in consideration of the safety of the process.

Figure 6:
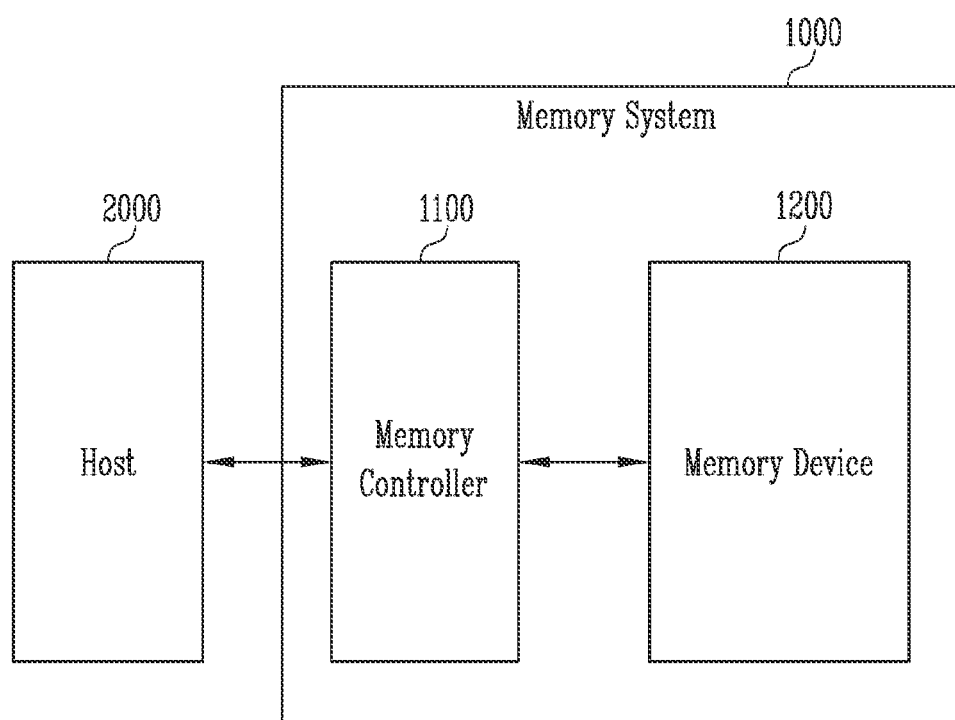
FIG. 6 is a diagram illustrating a memory system in accordance with an embodiment of the present disclosure.

FIG. 6 is a diagram illustrating a memory system 1000 in accordance with an embodiment of the present disclosure.

Referring to FIG. 6, the memory system 1000 may include a memory device 1200 configured to store data, and a memory controller 1100 configured to communicate between the memory device 1200 and a host 2000.

The host 2000 may be a device or system configured to store data in the memory system 1000 or retrieve the data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

The host 2000 may include at least one of a computer, a portable digital device, a tablet PC, a digital camera, a digital audio player, a television, a wireless communication device, and a cellular phone, but embodiments of the present disclosure are not limited thereto.

The memory controller 1100 may control overall operations of the memory system 1000. The memory controller 1100 may control the memory device 1200 according to the request of the host 2000. The memory controller 1100 may control the memory device 1200 to perform a program operation, a read operation, an erase operation, and the like according to the request of the host 2000. Alternatively, the memory controller 1100 may perform a background operation for improving the performance of the memory system 1000 even if there is no request from the host 2000.

The memory controller 1100 may transmit a control signal and a data signal to the memory device 1200 to control the operation of the memory device 1200. The control signal and the data signal may be transmitted to the memory device 1200 through different input/output lines. The data signal may include a command, an address, or data. The control signal may be used to identify a section in which the data signal is input.

The memory device 1200 may perform the program operation, the read operation, and the erase operation under the control of the memory controller 1100. The memory device 1200 may be a volatile memory device in which data stored therein is lost when power supply is interrupted, or a non-volatile memory device in which data stored therein is retained even when power supply is interrupted. The memory device 1200 may be a semiconductor device having a structure described with reference to FIGS. 1A and 1B. The memory device 1200 may be a semiconductor device manufactured by the manufacturing method described with reference to FIGS. 2A to 5. In an embodiment, the semiconductor device may be a flash memory device.

When the program operation, the read operation, or the erase operation is requested from the host 2000, the program operation, the read operation, or the erase operation is commanded to the memory device 1200. By this method, cell performance characteristics, retention characteristics, and the like may be improved.

Figure 7:
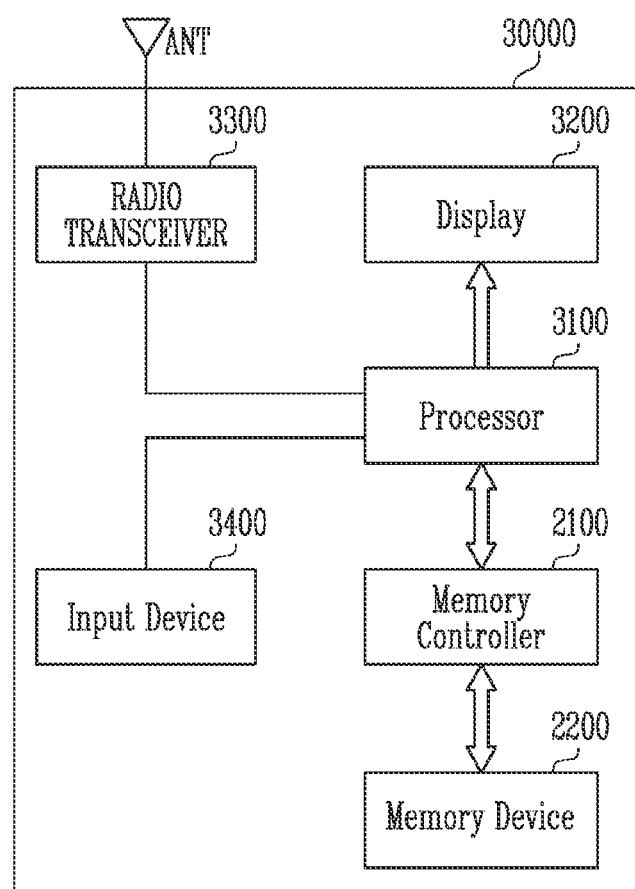
FIG. 7 is a diagram illustrating a memory system in accordance with an embodiment of the present disclosure.

FIG. 7 is a diagram illustrating a memory system 30000 in accordance with an embodiment of the present disclosure.

Referring to FIG. 7, the memory system 30000 may be embodied in a cellular phone, a smartphone, a tablet personal computer (PC), a personal digital assistant (PDA) or a wireless communication device. The memory system 30000 may include a memory device 2200 and a memory controller 2100 configured to control the operation of the memory device 2200.

The memory controller 2100 may control a data access operation, e.g., a program operation, an erase operation, or a read operation, of the memory device 2200 under the control of a processor 3100.

Data programmed in the memory device 2200 may be outputted through a display 3200 under the control of the memory controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 2100, data outputted from the radio transceiver 3300, or data outputted form the input device 3400 is outputted through the display 3200.

In an embodiment, the memory controller 2100 capable of controlling the operation of the memory device 2200 may be embodied as a part of the processor 3100 or a chip provided separately from the processor 3100.

Figure 8:
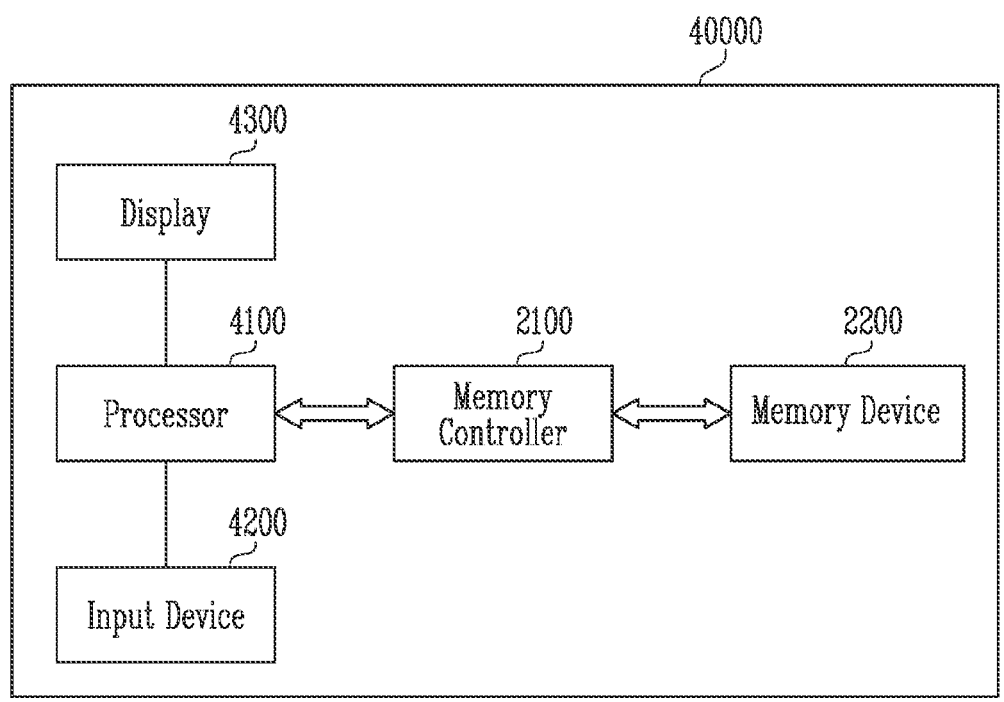
FIG. 8 is a diagram illustrating a memory system in accordance with an embodiment of the present disclosure.

FIG. 8 is a diagram illustrating a memory system 40000 in accordance with an embodiment of the present disclosure.

Referring to FIG. 8, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a memory controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 2100. In an embodiment, the memory controller 2100 capable of controlling the operation of the memory device 2200 may be embodied as a part of the processor 4100 or a chip provided separately from the processor 4100.

Figure 9:
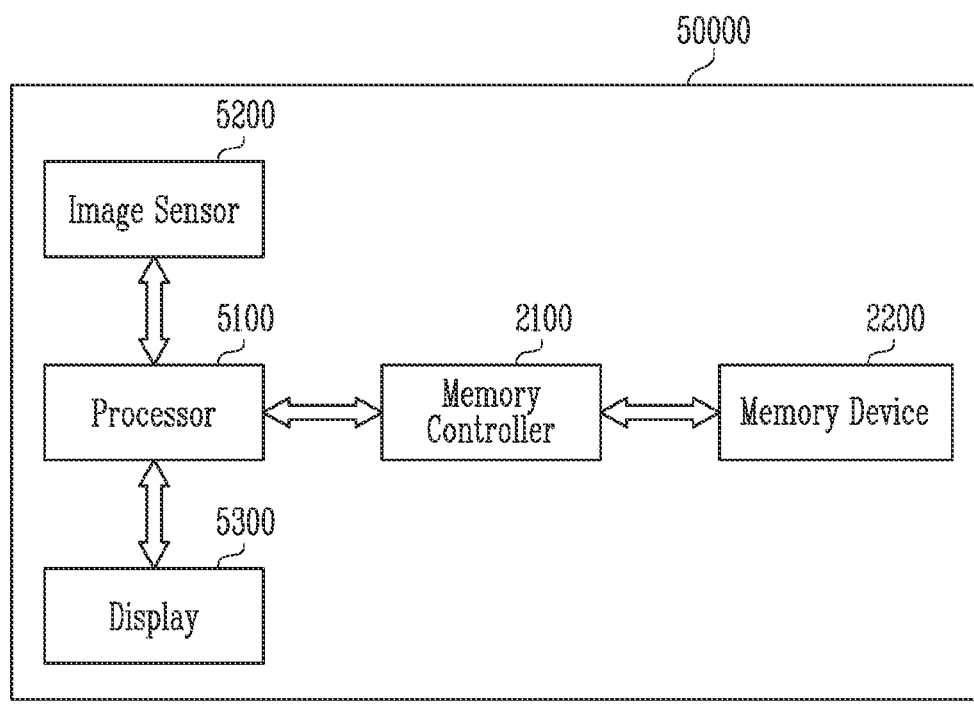
FIG. 9 is a diagram illustrating a memory system in accordance with an embodiment of the present disclosure.

FIG. 9 is a diagram illustrating a memory system 50000 in accordance with an embodiment of the present disclosure.

Referring to FIG. 9, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a memory controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the memory controller 2100. Under the control of the processor 5100, the converted digital signals may be outputted through a display 5300 or stored in the memory device 2200 through the memory controller 2100. Data stored in the memory device 2200 may be outputted through the display 5300 under the control of the processor 5100 or the memory controller 2100.

In an embodiment, the memory controller 2100 capable of controlling the operation of the memory device 2200 may be embodied as a part of the processor 5100 or a chip provided separately from the processor 5100.

Figure 10:
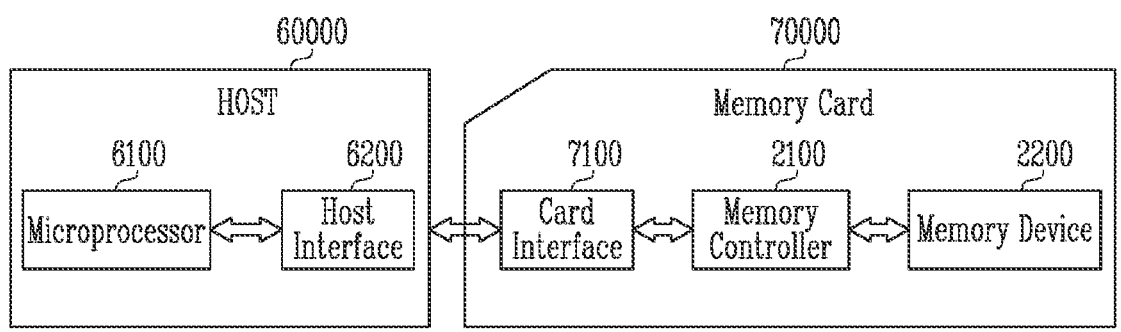
FIG. 10 is a diagram illustrating a memory system in accordance with an embodiment of the present disclosure.

FIG. 10 is a diagram illustrating a memory system 70000 in accordance with an embodiment of the present disclosure.

Referring to FIG. 10, the memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

A semiconductor device which has a stable structure and is improved in reliability can be provided.

What is claimed is:

1. A semiconductor device, comprising:
    a stack including alternately stacked conductive layers and insulating layers;
    a channel layer passing through the stack, the channel layer comprising deuterium; and
    a data storage layer between the conductive layers and the channel layer, the data storage layer comprising deuterium at a concentration higher than a concentration of deuterium in the channel layer.

2. The semiconductor device according to claim 1, further comprising:
    a tunnel insulating layer between the channel layer and the data storage layer; and
    a blocking layer between the data storage layer and the conductive layers,
    wherein the concentration of deuterium in the data storage layer is higher than a concentration of deuterium in the blocking layer and a concentration of deuterium in the tunnel insulating layer.

3. The semiconductor device according to claim 2, wherein the concentration of deuterium in the tunnel insulating layer is higher than the concentration of deuterium in the blocking layer.

4. The semiconductor device according to claim 2, wherein the concentration of deuterium in the channel layer is higher than the concentration of deuterium in the blocking layer.

5. The semiconductor device according to claim 1, further comprising:
    blocking patterns between the conductive layers and the data storage layer,
    wherein a concentration of deuterium in the blocking patterns is lower than the concentration of deuterium in the data storage layer and the concentration of deuterium in the channel layer.

* * * * *